United States Patent
Lee et al.

(10) Patent No.: US 11,145,791 B2
(45) Date of Patent: Oct. 12, 2021

(54) LIGHT-EMITTING DEVICE

(71) Applicant: EPISTAR CORPORATION, Hsinchu (TW)

(72) Inventors: Shih-Chang Lee, Hsinchu (TW); Meng-Yang Chen, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 16/725,708

(22) Filed: Dec. 23, 2019

(65) Prior Publication Data
US 2020/0212261 A1 Jul. 2, 2020

(30) Foreign Application Priority Data
Dec. 26, 2018 (TW) ................................ 107147263

(51) Int. Cl.
*H01L 33/60* (2010.01)
*H01L 33/06* (2010.01)
*H01L 33/14* (2010.01)
*H01L 33/30* (2010.01)

(52) U.S. Cl.
CPC ............ *H01L 33/305* (2013.01); *H01L 33/06* (2013.01); *H01L 33/145* (2013.01)

(58) Field of Classification Search
CPC ...... H01L 33/305; H01L 33/145; H01L 33/06
See application file for complete search history.

(56) References Cited

U.S. PATENT DOCUMENTS

| | | | |
|---|---|---|---|
| 6,233,266 B1 | 5/2001 | Kawasumi | |
| 7,042,013 B2 | 5/2006 | Linder et al. | |
| 7,470,934 B2 | 12/2008 | Linder | |
| 2001/0028061 A1* | 10/2001 | Hosoba | H01L 33/30 257/76 |
| 2008/0137701 A1* | 6/2008 | Freund | H01S 5/32341 372/45.011 |
| 2011/0211608 A1* | 9/2011 | Fujimoto | H01S 5/20 372/45.01 |
| 2012/0235116 A1* | 9/2012 | Su | H01L 33/06 257/13 |
| 2015/0349202 A1* | 12/2015 | Yamamoto | H01L 33/0095 257/98 |
| 2017/0069790 A1* | 3/2017 | Choi | H01L 33/16 |

* cited by examiner

*Primary Examiner* — Julio J Maldonado
*Assistant Examiner* — Mohammad A Rahman
(74) *Attorney, Agent, or Firm* — Juan Carlos A. Marquez; Marquez IP Law Office, PLLC

(57) ABSTRACT

A light-emitting device is provided, which includes a first semiconductor structure, an active structure, a second semiconductor structure, and a first blocking layer. The first semiconductor structure has a first conductivity type. The active structure is on the first semiconductor structure and has a first dopant. The second semiconductor structure is on the active structure and has a second conductivity type different from the first conductivity type. The first blocking layer is between the second semiconductor structure and the active structure. The first blocking layer has the first dopant with a first doping concentration decreasing along a depth direction from the second semiconductor structure to the first semiconductor structure.

20 Claims, 5 Drawing Sheets

LIGHT-EMITTING DEVICE

CROSS REFERENCE TO RELATED APPLICATIONS

This application claims the right of priority based on TW Application Serial No. 107147263, filed on Dec. 26, 2018, and the content of which is hereby incorporated by reference in its entirety.

FIELD OF DISCLOSURE

The present disclosure relates to a light-emitting device and in particular to a light-emitting diode.

BACKGROUND OF THE DISCLOSURE

With the rapid development of technology, semiconductor devices play a very important role in many fields, such as information transmission and energy conversion. Researches and developments of related materials have been made in recent years. The semiconductor material may be applied to various optoelectronic devices, such as a light-emitting diode (LED), a laser diode (LD), or a solar cell, and may also be applied in illumination, display, communication, sensing, power system, and other fields.

The principle of light emission of a light-emitting diode (LED) is to apply an electric current to combine electrons from an n-type semiconductor layer with holes from a p-type semiconductor layer, and release a part of energy in the form of light. Light-emitting diode devices are suitable for solid-state lighting sources and have the advantages of low power consumption and long operating lifetime. Therefore, light-emitting diode devices have been gradually replacing traditional light sources and are widely used in traffic signals, backlight modules, various lighting fixtures or medical equipment.

SUMMARY OF THE DISCLOSURE

The present disclosure provides a light-emitting device. The light-emitting device includes a first semiconductor structure, an active structure, a second semiconductor structure, and a first blocking layer. The first semiconductor structure has a first conductivity type. The active structure is on the first semiconductor structure. The second semiconductor structure is on the active structure and has a second conductivity type different from the first conductivity type. The first blocking layer is between the second semiconductor structure and the active structure. The first blocking layer substantially does not contain aluminum.

DETAILED DESCRIPTION OF THE DISCLOSURE

Figure 1:
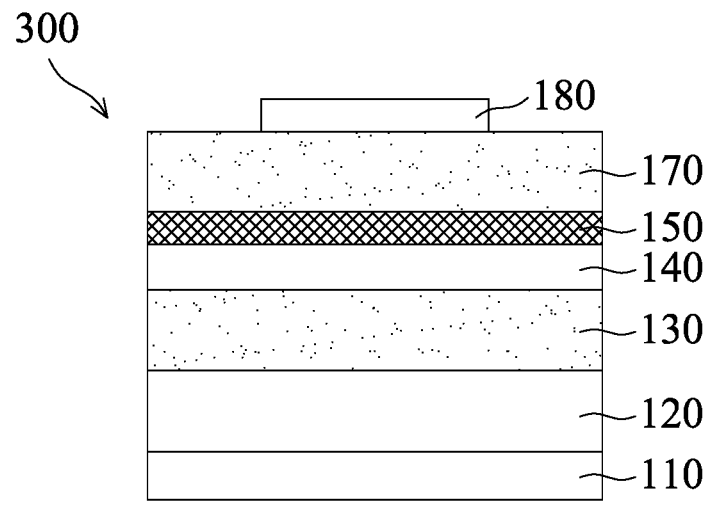
FIG. 1 shows a schematic cross-sectional view of a light-emitting device in accordance with an embodiment of the present disclosure.

The following embodiments will be described with accompany drawings to disclose the concept of the present disclosure. It should be noted that a person skilled in the art may modify the following embodiments as needed, such as changing the order of the processes and/or including more or fewer steps than those described herein. In the drawings or description, same or similar portions are indicated with same numerals. To describe the present disclosure in a clear and concise manner, repeated descriptions of same or similar components may be omitted in the embodiments.

Furthermore, other components may be added according to the following embodiments. For example, the description of "forming a second component on a first component" may include an embodiment in which the first component is in physical contact with the second component, and may also include an embodiment in which another component is located between the first component and the second component, such that the first component is not in physical contact with the second component. In addition, the spatial relationship of the first component and the second component may be changed when the device is operated or used in different orientations.

For convenience of explanation, the present disclosure will be described below as a quaternary light-emitting device, but the present disclosure is not limited thereto. The present disclosure is also applicable to other types of semiconductor devices, such as binary, ternary light-emitting devices or other semiconductor devices. Although in some embodiments, the two electrodes of the light-emitting device are respectively located on two sides of the light-emitting device, the present disclosure is not limited thereto. In some embodiments, the two electrodes may also be located on the same side of the light-emitting device.

In the present disclosure, if not otherwise specified, the general formula AlInP represents $Al_{x1}In_{(1-x1)}P$, wherein $0<x1<1$; the general formula AlGaInP represents $(Al_{y1}Ga_{(1-y1)})_{1-x2}In_{x2}P$, wherein $0<x2<1$, $0<y1<1$; the general formula InGaP represents $In_{x3}Ga_{1-x3}P$, wherein $0<x3<1$. The content of each element may be adjusted for different purposes, for example, adjusting the energy gap, or when the semiconductor device is a light-emitting device, the peak wavelength or dominant wavelength may be adjusted. Furthermore, in the present disclosure, the description "substantially consist of X material" means that the main composition of the layer is X material, but does not exclude the inclusion of dopants or unavoidable impurities.

Qualitative or quantitative analysis of the composition and/or dopant contained in each layer of the semiconductor device of the present disclosure may be conducted by any suitable method, for example, a secondary ion mass spectrometer (SIMS). A thickness of each layer may be obtained by any suitable method, such as a transmission electron microscopy (TEM) or a scanning electron microscope (SEM).

FIG. 1 shows a schematic cross-sectional view of a light-emitting device 300 in accordance with an embodiment. The light-emitting device 300 includes a substrate 120, a first semiconductor structure 130, an active structure 140, a first blocking layer 150, a second semiconductor structure 170, a first electrode 110, and a second electrode 180. The first semiconductor structure 130, the active structure 140, and the second semiconductor structure 170 may respectively include a plurality of layers. The substrate 120 may be a growth substrate for epitaxial growth. In an embodiment, the substrate 120 may be a support substrate which bonds to an epitaxial structure through a bonding layer after the growth substrate is removed. The substrate 120 may be a conductive substrate or an insulating substrate. In some embodiments, the substrate 120 may include a conductive material, such as gallium arsenide (GaAs), gallium nitride (GaN), gallium phosphide (GaP), indium phosphide (InP), silicon carbide (SiC) or silicon (Si), or include an insulative material such as sapphire ($Al_2O_3$).

The first semiconductor structure 130, the active structure 140, the first blocking layer 150, and the second semiconductor structure 170 on the substrate 120 may be formed by liquid phase epitaxy (LPE), molecular beam epitaxy (MBE), chemical beam epitaxy (CBE), metal-organic chemical vapor deposition (MOCVD), or hydride vapor phase epitaxy (HVPE), and may be formed sequentially on the substrate 120.

The active structure 140 is located on the substrate 120 and is between the first semiconductor structure 130 and the second semiconductor structure 170. The first electrode 110 and the second electrode 180 can electrically connect to the active structure 140. The active structure 140 may include a single heterostructure (SH), a double heterostructure (DH), a double-side double heterostructure (DDH), or a multiple quantum wells (MQW) structure. When the light-emitting device 300 is in operation, the active structure 140 can emit a radiation during operation. The radiation may be in the visible range, and preferably have a dominant wavelength in a range of 550 nm to 660 nm. Furthermore, when the radiation is red light, it preferably has a dominant wavelength in a range of 600 nm to 650 nm, for example, 610 nm, 612 nm, 615 nm, 625 nm, 630 nm, or 640 nm. The active structure 140 may include a first semiconductor material composed of group III and group V elements in the periodic table. The group III element may be aluminum (Al), gallium (Ga) or indium (In). The group V element may be arsenic (As) or phosphorus (P). In an embodiment, the first semiconductor material does not include nitrogen (N). When the active structure 140 has a multiple quantum well structure, it includes a plurality of barrier layers and a plurality of well layers that are alternately stacked. In some embodiments, the barrier layers and the well layers may respectively include a quaternary semiconductor material or a ternary semiconductor material. Specifically, the barrier layers and the well layers may include aluminum (Al), gallium (Ga), phosphorus (P) or indium (In). Preferably, the barrier layers substantially consist of a quaternary semiconductor material (such as AlGaInP). Preferably, the well layers substantially consist of a ternary semiconductor material (such as InGaP). In an embodiment, the active structure 140 and the substrate 120 are lattice matched.

The first semiconductor structure 130 and the second semiconductor structure 170 are respectively located on two sides of the active structure 140. The first semiconductor structure 130 and the second semiconductor structure 170 may respectively include a second semiconductor material composed of group III and group V elements in the periodic table. The group III element may be aluminum (Al), gallium (Ga), or indium (In). The group V element may be arsenic (As) or phosphorus (P). In an embodiment, the first semiconductor structure 130 and the second semiconductor structure 170 does not contain nitrogen (N). The first semiconductor structure 130 and the second semiconductor structure 170 may respectively include a binary, ternary, or quaternary semiconductor material, such as GaP, AlInP, or AlGaInP. Preferably, the first semiconductor structure 130 substantially consists of a quaternary semiconductor material (such as AlGaInP), and/or the second semiconductor structure 170 substantially consists of a ternary semiconductor material (such as AlInP). In an embodiment, the first semiconductor structure 130 has a first conductivity type, and the second semiconductor structure 170 has a second conductivity type different from the first conductivity type. The first conductivity type and the second conductivity type may be respectively n-type and p-type. In an embodiment, the first conductivity type is n-type and the second conductivity type is p-type. In another embodiment, the first conductivity type is p-type and the second conductivity type is n-type.

The first semiconductor structure 130 and the second semiconductor structure 170 may have different conductivity types by containing different dopants. Examples of the dopants include magnesium (Mg), zinc (Zn), silicon (Si), or tellurium (Te). In some embodiments, the first semiconductor structure 130 and the second semiconductor structure 170 can be doped by an in-situ doping during epitaxial growth and/or by an implantation of a p-type or n-type dopant after the epitaxial growth. In an embodiment, a doping concentration of the dopant in the first semiconductor structure 130 and the second semiconductor structure 170 may respectively be in a range of $2\times10^{17}$ $cm^3$ to $1\times10^{20}$ $cm^3$, for example, $5\times10^{17}$ $cm^3$ to $5\times10^{19}$ $cm^3$.

The first semiconductor structure 130 may have a first thickness and the second semiconductor structure 170 may have a second thickness. In an embodiment, the second thickness is greater than or equal to the first thickness. In an embodiment, the first thickness may be in a range of 0.1 μm to 5 μm. In an embodiment, the second thickness may be in a range of 0.5 μm to 10 μm.

As shown in FIG. 1, the first blocking layer 150 is located between the second semiconductor structure 170 and the active structure 140. In the embodiment, the first blocking layer 150 is substantially free of aluminum (Al). Specifically, "substantially free of aluminum" means that the aluminum content in the first blocking layer 150 is lower than or equal to 1%, that is, the aluminum content is in the range of 0% to 1% (in atomic percent). Specifically, the first blocking layer 150 may be formed by an epitaxial growth process in which aluminum is not a constituent element or added as dopant of the first blocking layer 150. The first blocking layer 150 which is substantially free of aluminum may be used as a diffusion control layer between the second semiconductor structure 170 and the active structure 140, thereby preventing the diffusion of a dopant (such as magnesium) from the second semiconductor structure 170 into the active structure 140 that results in low optical power (power, in mW) of the light-emitting device. The reliability of the light-emitting device can be further improved.

The first blocking layer 150 may include a first III-V group semiconductor material. Preferably, the first blocking layer 150 substantially consists of the first III-V group semiconductor material. The first III-V group semiconductor material may include a ternary or quaternary semiconductor material (such as InGaP). In an embodiment, the first III-V group semiconductor material may include gallium (Ga), arsenic (As), phosphorus (P) or indium (In). In an embodiment, the first III-V group semiconductor material does not contain nitrogen (N). Preferably, the first III-V group semiconductor material substantially consists of a ternary or quaternary semiconductor material, such as $In_xGa_{(1-x)}P$, wherein $0<x\leq0.5$, preferably $0.1\leq x\leq0.45$, and more preferably $0.2\leq x\leq0.35$, thereby the optical power of the light-emitting device may be improved, and the reliability of the light-emitting device may also be further improved.

In some embodiments, the first blocking layer 150 includes a dopant. Examples of the dopant include magnesium (Mg), zinc (Zn), silicon (Si), or tellurium (Te). The dopant may be added to the second semiconductor structure 170 for adjusting the electrical conductivity and/or the conductivity type of the second semiconductor structure 170. The dopant may diffuse from the second semiconductor structure 170 to the first blocking layer 150 such that first blocking layer 150 and/or active structure 140 may include the dopant. Specifically, the dopant may be not directly or intentionally added into the first blocking layer 150, such as by in-situ doping and/or implantation of a p-type or n-type dopant. In an embodiment, the dopant may further diffuse from the first blocking layer 150 into the active structure 140. When the first blocking layer 150 and/or the active structure 140 is analyzed by secondary ion mass spectrometer, the doping concentration of the dopant in the first blocking layer may be greater than $5\times10^{17}$ $cm^{-3}$, and the doping concentration of the dopant in the active structure 140 may be less than $10^{17}$ $cm^{-3}$. In an embodiment, the doping concentration of the dopant in the active structure 140 exhibits an irregular signal. In some embodiments, the doping concentration of the dopant in the first blocking layer 150 is higher than the doping concentration of the dopant in the second semiconductor structure 170 and is also higher than the doping concentration of the dopant in the active structure 140. Since the dopant diffusing into the first blocking layer 150 comes from the second semiconductor structure 170, the first blocking layer 150 may have the same conductivity type as the second semiconductor structure 170.

In an embodiment, a band gap of the first blocking layer 150 is greater than or equal to the energy of the radiation emitted by the active structure 140. That is, the first blocking layer 150 may not absorb the radiation emitted by the active structure 140, thereby power loss of the light-emitting device can be avoided.

In some embodiments, the first blocking layer 150 and the active structure 140 are lattice mismatched, and a lattice stress is presented in the first blocking layer 150. In an embodiment, the first blocking layer 150 has a tensile strain. In order to avoid peeling of the first blocking layer 150 and the active structure 140 resulting from the lattice stress, the thickness of the first blocking layer 150 may be in a range of 1 nm to 300 nm, 1 nm to 200 nm, or less than or equal to 100 nm. In an embodiment, the thickness of the first blocking layer 150 may be in a range of 10 nm to 20 nm (such as 15 nm).

The first electrode 110 and the second electrode 180 can electrically connect to an external power source to provide a current path. In the embodiment, the first electrode 110 may be adjacent to the substrate 120 and the second electrode 180 may be adjacent to the second semiconductor structure 170. Further, the material(s) of the first electrode 110 and the second electrode 180 may be the same or different, and may include a transparent conductive material, such as metal or alloy. The transparent conductive material may include conductive oxide, such as indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium zinc oxide (GZO), indium tungsten oxide (IWO), zinc oxide (ZnO), or indium zinc oxide (IZO). The metal may include gold (Au), platinum (Pt), titanium (Ti), aluminum (Al), copper (Cu) or nickel (Ni). The alloy may include at least two elements selected from the above-mentioned metal elements. The alloy may be GeAuNi, BeAu, GeAu, or ZnAu.

A reliability test can be performed on a light-emitting device 300 which has the first blocking layer 150, in which a light-emitting device having the same structure as the light-emitting device 300 but without the first blocking layer 150 are also tested as a reference example. An uninterrupted fixed current (30 mA) is respectively provided to the light-emitting device without the first blocking layer and the light-emitting device 300 having the first blocking layer 150 under a 55° C. environment, then changes in optical power of the light-emitting devices are observed (in units mW) and the ratios of the optical power of the light-emitting devices to the initial optical power (optical power ratio) after different lengths of time (1 hour, 24 hours, 96 hours) are respectively calculated. The initial optical power is defined as the current value measured at the beginning of applying the current (for example, at 0 minutes). The test results are shown in Table 1 below.

TABLE 1

|  | Ratio of optical power (1 hour) | Ratio of optical power (24 hour) | Ratio of optical power (96 hour) |
| --- | --- | --- | --- |
| Without the first blocking layer | 0.90 | 0.62 | 0.51 |
| Including the first blocking layer | 0.97 | 0.93 | 1.05 |

The test results in FIG. 1 show that the light-emitting 300 device having the first blocking layer 150 has an optical power ratio greater than 0.9 after 24 hours. Moreover, the light power ratio of the light-emitting device 300 having the first blocking layer 150 is greater than 1 after 96 hours. However, the light-emitting device without the first blocking layer 150 has an optical power ratio of less than 0.65 after 24 hours and has an optical power ratio of less than 0.6 after 96 hours.

Based on the above, the dopant may be effectively trapped in the first blocking layer 150, and blocked from further diffusion into the active structure 140 by providing the first blocking layer 150 in the light-emitting device 300, thereby the reliability of the light-emitting device 300 may be elevated. In some embodiments, the first blocking layer 150 may not absorb the light emitted from the active structure 140, thereby the optical power loss of the light-emitting device can be further reduced.

The first blocking layer 150 of the present disclosure can also be applied to light-emitting devices having different structures. For the sake of brevity, the same or similar structures are indicated by the same numeral in the following embodiments. The processes and materials for forming the structures are as described above and are not described repeatedly.

Figure 2:
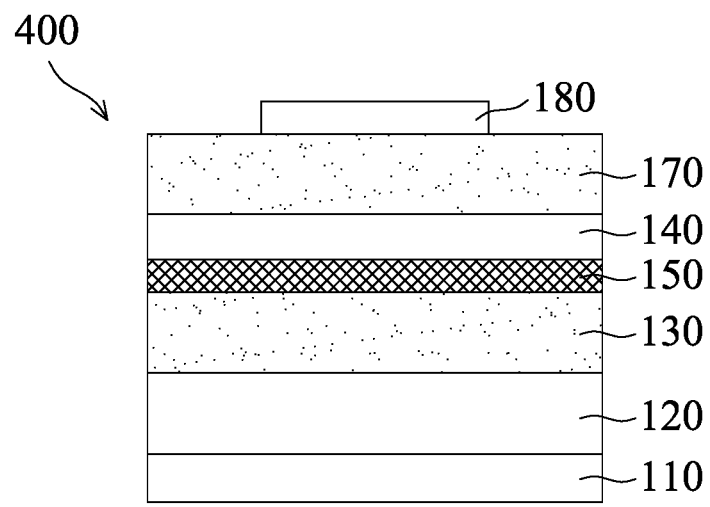
FIG. 2 shows a schematic cross-sectional view of another light-emitting device in accordance with an embodiment of the present disclosure.

FIG. 2 is a cross-sectional view showing a light-emitting device 400 according to another embodiment. The light-emitting device 400 includes a substrate 120, a first semiconductor structure 130, an active structure 140, a first blocking layer 150, a second semiconductor structure 170, a first electrode 110, and a second electrode 180. In an embodiment, the first conductivity type of the first semiconductor structure 130 of the light-emitting device 400 is p-type, and the second conductivity type of the second semiconductor structure 170 is n-type. As shown in FIG. 2, the first blocking layer 150 is located between the first semiconductor structure 130 and the active structure 140. As described above, by providing the first blocking layer 150 between the first semiconductor structure 130 and the active structure 140, diffusion of the dopant in the first semiconductor structure 130 into the active structure 140 may be blocked, such that the reliability of the light-emitting device 400 may be improved.

In an embodiment, a bonding layer (not shown) may be further provided between the substrate 120 and the first semiconductor structure 130. The bonding layer can connect the substrate 120 and the first semiconductor structure 130. In another embodiment, a reflective structure (not shown) may be further provided between the substrate 120 and the first semiconductor structure 130 to reflect the radiation emitted by the active structure 140, so that the light efficacy of the light-emitting device can be further improved. The material of the reflective structure may include metal or alloy. In an embodiment, the reflective structure is adjacent to the bonding layer. The reflective structure may be closer to the active structure 140 than the bonding layer.

Figure 3:
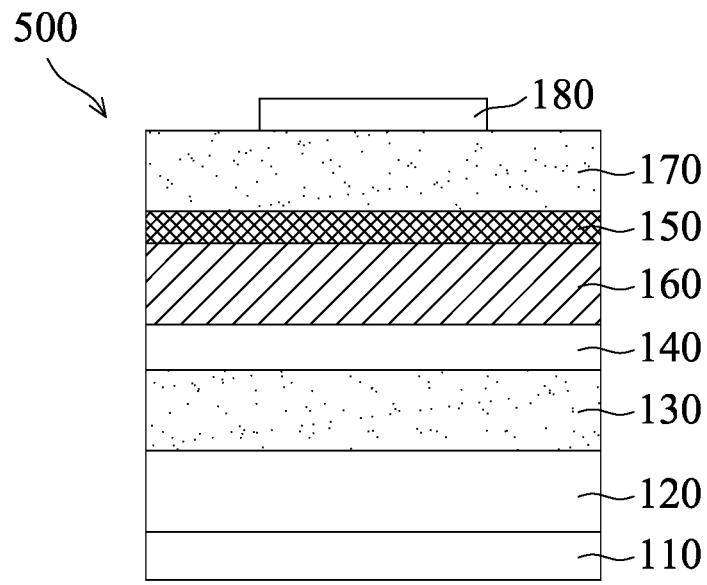
FIG. 3 shows a schematic cross-sectional view of another light-emitting device in accordance with an embodiment of the present disclosure.

In order to further block the diffusion of the dopant, a second blocking layer 160 may be provided in the light-emitting device. FIG. 3 is a cross-sectional view showing a light-emitting device 500 in accordance with an embodiment. In the embodiment, the light-emitting device 500 includes a first blocking layer 150 and a second blocking layer 160. As shown in FIG. 3, the first blocking layer 150 is disposed between the second semiconductor structure 170 and the active structure 140, and the second blocking layer 160 is disposed under the first blocking layer 150. The second blocking layer 160 may be adjacent to the first blocking layer 150 and the active structure 140 to further block diffusion of the dopant in the second semiconductor structure 170. Specifically, the second blocking layer 160 also includes a dopant. Examples of the dopant may include magnesium (Mg), zinc (Zn), silicon (Si), or tellurium (Te). As with the first blocking layer 150, the dopant may diffuse from the second semiconductor structure 170 to the first blocking layer 150 then diffuse into the second blocking layer 160. The dopant is not formed by directly or intentionally addition to the second blocking layer 160. Since the second blocking layer 160 can be disposed between the first blocking layer 150 and the active structure 140, the amount of the dopant diffused into the active structure 140 can be reduced, thereby improving the light-emitting efficiency of the light-emitting device. Similarly, when the second blocking layer 160 is analyzed by secondary ion mass spectrometer, the doping concentration of the dopant in the second blocking layer 160 may be less than $1 \times 10^{18}$ cm$^{-3}$. The doping concentration of the dopant in the active structure 140 may exhibit an irregular signal. In some embodiments, the doping concentration of the dopant in the second blocking layer 160 may be lower than the doping concentration of the dopant in the second semiconductor structure 170 and the first blocking layer 150, but may be higher than the dopant in the active structure 140. Since the dopants in the first blocking layer 150 and the second blocking layer 160 may come from the second semiconductor structure 170, the first blocking layer 150 and the second blocking layer 160 may have the same conductivity type as the second semiconductor structure 170. In an embodiment, the first conductivity type of the first semiconductor structure 130 is n-type, and the second conductivity type of the second semiconductor structure 170 is p-type. In an embodiment, the conductivity types of the first blocking layer 150 and the second blocking layer 160 may be both p-type.

In some embodiments, the process and material for forming the second blocking layer 160 may be similar to the process and material of forming the first blocking layer 150. The second blocking layer 160 and the first blocking layer 150 may be formed by the same or different processes. In an embodiment, the second blocking layer 160 may include aluminum. Specifically, "include aluminum" means, for example, the aluminum content in the second blocking layer 160 is greater than 1% (in atomic percent). The second blocking layer 160 may include a second III-V group semiconductor material. Preferably, the second blocking layer 160 substantially consists of the second III-V group semiconductor material. Specifically, the second III-V group semiconductor material may include a ternary or quaternary semiconductor material (such as AlGaInP). The second III-V group semiconductor material can be different than the first III-V group semiconductor material. The second III-V group semiconductor material may include aluminum (Al), gallium (Ga), arsenic (As), phosphorus (P) or indium (In). In an embodiment, the second III-V group semiconductor material does not contain nitrogen (N).

In an embodiment, the second blocking layer 160 may only include a quaternary semiconductor material (such as AlGaInP). In some embodiments, the thickness of the second blocking layer 160 may be in a range of 0.1 μm to 0.5 μm. For example, the thickness of the second blocking layer 160 may be in a range of 0.3 μm to 0.4 μm, such as 0.35 μm. In an embodiment, the thickness of the second blocking layer 160 is greater than the thickness of the first blocking layer 150. In some embodiments, the ratio of the thickness of the second blocking layer 160 to the thickness of the first blocking layer 150 may be in the range of 10:1 to 30:1. In addition, since the second blocking layer 160 and the active structure 140 are lattice matched, the lattice stress generated by lattice difference can be avoided, and thereby the yield of the light-emitting device can be improved. Based on the above, providing the first blocking layer 150 and the second blocking layer 160 in the light-emitting device 500 can further block the diffusion of the dopant, such that the reliability of the light-emitting device can also be improved.

Figure 4:
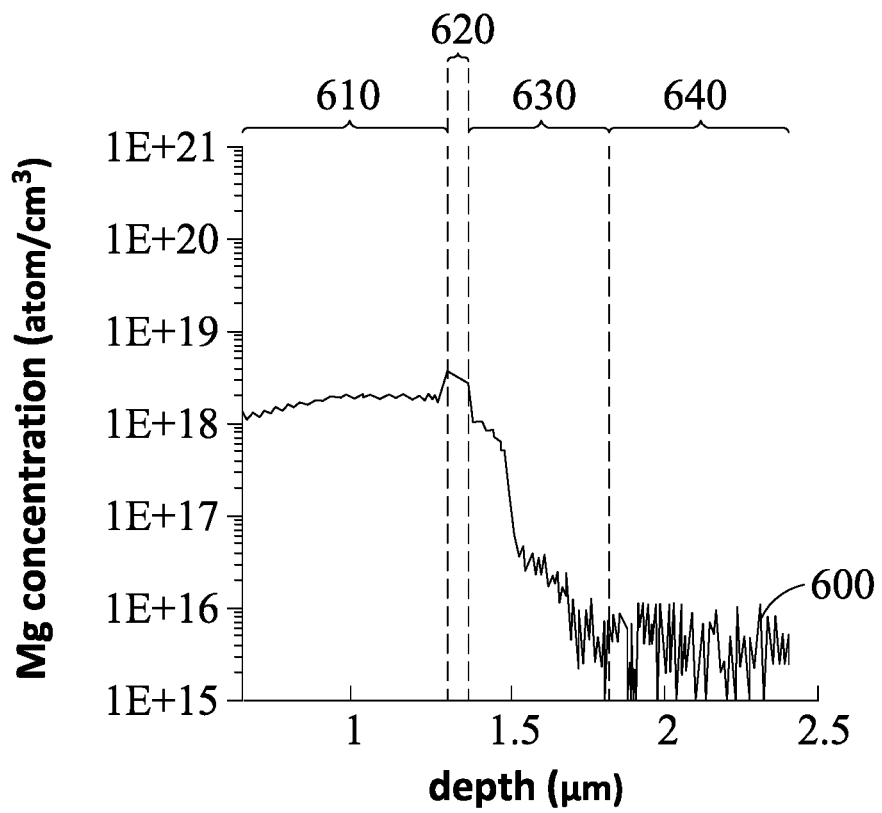
FIG. 4 is a graph showing the relationship between concentrations of an element and depths in a portion of a light-emitting device of the present disclosure in accordance with an embodiment.

FIG. 4 is a graph showing the relationship between concentrations of an element and depths in a portion of a light-emitting device of the present disclosure. Specifically, FIG. 4 shows a result of secondary ion mass spectrometry (SIMS) analysis of a partial structure in the light-emitting device 500 as shown in FIG. 3. Specifically, in the light-emitting device 500, the first semiconductor structure 130 may be an n-type semiconductor which includes AlInP and AlGaInP. The second semiconductor structure 170 may be a p-type semiconductor which includes AlGaInP and GaP. The dopant in the second semiconductor structure 170 can be magnesium (Mg). The first blocking layer 150 may include InGaP, the second blocking layer 160 may include AlGaInP, and the active structure 140 includes a well layer including InGaP and a barrier layer including AlGaInP. The concentration of magnesium in the light-emitting device 500 of this embodiment is indicated as magnesium concentration 600.

As shown in FIG. 4, the partial structure in the light-emitting device 500 can be divided into a first region 610, a second region 620, a third region 630, and a fourth region 640 along the depth and layer order in the light-emitting device 500. The first region 610 can correspond to the second semiconductor structure 170 which is doped with magnesium and has a conductivity type of p-type, the second region 620 can correspond to the first blocking layer 150, the third region 630 can correspond to the second blocking layer 160, and the fourth region 640 can correspond to active structure 140. As shown in FIG. 4, the magnesium concentration 600 is maintained at a level of higher than $1 \times 10^{18}$ $cm^{-3}$ in the first region 610. The magnesium concentration 600 may have a highest value which exceeds $2 \times 10^{18}$ $cm^{-3}$ near an interface between the first region 610 and the second region 620. Next, the magnesium concentration 600 rapidly decreases to $1 \times 10^{17}$ $cm^{-3}$ or less from the second region 620 to the third region 630, and the magnesium concentration 600 has the lowest value which is not more than about $1 \times 10^{16}$ $cm^{-3}$ in the fourth region 640. It can be inferred from the distribution of magnesium (Mg) in FIG. 4 that the first blocking layer 150 may have an effect on blocking the diffusion of magnesium, so that a highest magnesium concentration can be obtained near the interface between the second semiconductor structure 170 and the first blocking layer 150. Then, from the second region 620 to the third region 630, the magnesium concentration 600 rapidly decreases as the depth changes, indicating that by presence of the first blocking layer 150 and the second blocking layer 160 can further effectively reduce the magnesium concentration 600, and the magnesium concentration 600 in the active structure 140 can also be reduced, so that the reliability of the light-emitting device 500 may be improved.

Figure 5:
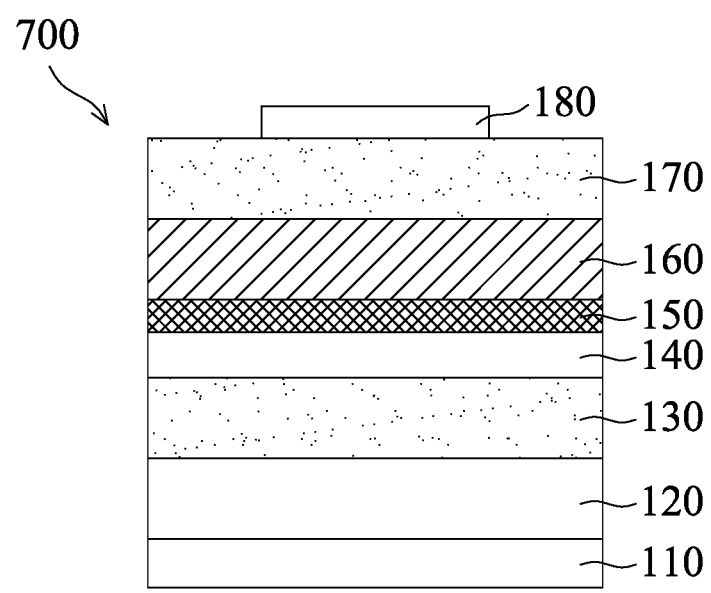
FIG. 5 is a cross-sectional view of a light-emitting device in accordance with another embodiment of the present disclosure.

On the other hand, the second blocking layer 160 of the present disclosure may be disposed at another position of the light-emitting device. FIG. 5 is a cross-sectional view showing a light-emitting device 700 according to another embodiment. In this embodiment, the first blocking layer 150 is disposed between the second semiconductor structure 170 and the active structure 140. The second blocking layer 160 may be disposed on the first blocking layer 150. The second blocking layer 160 may be adjacent to and located between the first blocking layer 150 and the second semiconductor structure 170. The first blocking layer 150 may be closer to the active structure 140 than the second blocking layer 160.

Although the above embodiment describes that a second blocking layer 160 is disposed on one side of the first blocking layer 150 and in physical contact with the first blocking layer 150, the present disclosure is not limited thereto. For example, in some embodiments, another structure may exist between the second blocking layer 160 and the first blocking layer 150. In some embodiments, the light-emitting device may include two second blocking layers 160 (not shown). The two second blocking layers 160 may be respectively located on two sides of the first blocking layer 150 or on the same side of the first blocking layer 150. The two second blocking layers 160 may physically contact the active structure 140 or the first blocking layer 150. Furthermore, the two second blocking layers 160 may be formed by the same or different methods and may include the same or different materials.

Figure 6A:
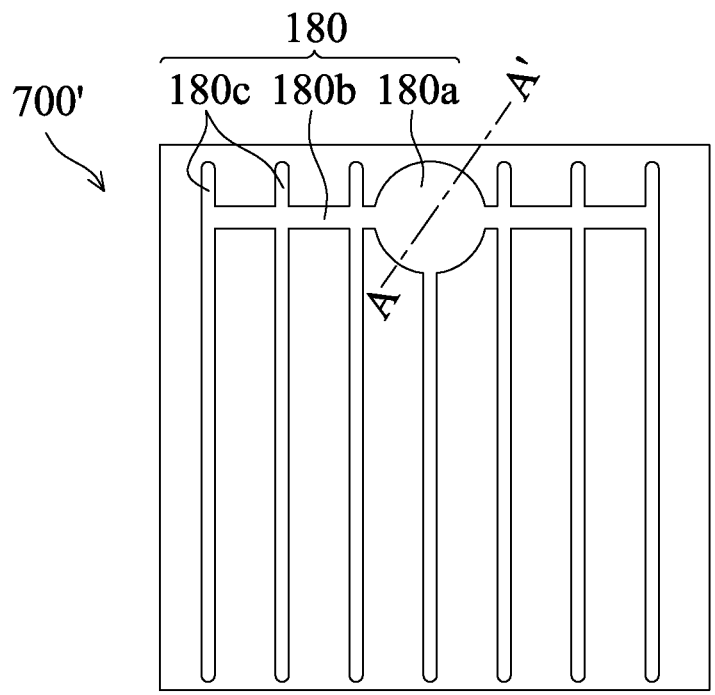
FIG. 6A and FIG. 6B are respectively a top view and a cross-sectional view of a light-emitting device in accordance with another embodiment of the present disclosure.
Figure 6B:
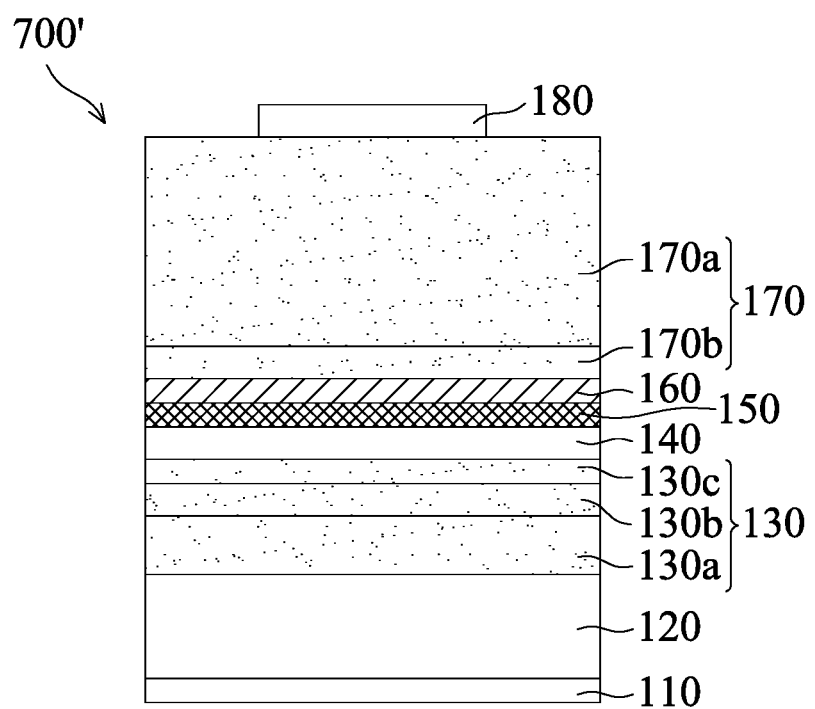

FIG. 6A and FIG. 6B are respectively a top view and a cross-sectional view of a light-emitting device 700' according to another embodiment. FIG. 6B is a schematic cross-sectional view of A-A' line in FIG. 6A. As shown in FIG. 6A, the second electrode 180 includes an electrode pad 180a, and a first extension electrode 180b extending from the electrode pad 180a and a plurality of second extension electrodes 180c to electrically connect to the electrode pad 180a. The electrode pad 180a has a circular shape and is in physical contact with the first extension electrode 180b. Each second extension electrode 180c intersects with the first extension electrode 180b or is in physical contact with the electrode pad 180a. The plurality of second extension electrodes 180c do not intersect each other and may be substantially parallel to each other.

As shown in FIG. 6B, the first semiconductor structure 130 and the second semiconductor structure 170 may respectively include a plurality of layers. The first semiconductor structure 130 may include a first window layer 130a, a first cladding layer 130b, and a first confinement layer 130c. The second semiconductor structure 170 may include a second window layer 170a and a second cladding layer 170b. The first window layer 130a may include a quaternary semiconductor material such as AlGaInP. The first cladding layer 130b may include a ternary semiconductor material such as AlInP. The first confinement layer 130c may include a quaternary semiconductor material such as AlGaInP. The second window layer 170a may include a binary semiconductor material such as GaP. The second cladding layer 170b may include a ternary semiconductor material such as AlInP.

In an embodiment, the second blocking layer 160 and the first confinement layer 130c may include the same semiconductor material. The thickness of the second window layer 170a may be preferably greater than the thickness of the second cladding layer 170b. In an embodiment, the thickness ratio of the second window layer 170a to the second cladding layer 170b is 10:1 or more and 15:1 or less. In this embodiment, the second blocking layer 160 may also serve as a confinement layer. In some embodiments, by providing the first confinement layer 130c, the second blocking layer 160, the first cladding layer 130b, and the second cladding layer 170b in the light-emitting device 700', carriers may be effectively confined in the active structure 140, thereby the efficiency of recombination between electrons and holes may be improved. For the positions, materials, and related descriptions of other layers or structures, the foregoing embodiments can be referred to, and are not repeatedly described herein.

Figure 7:
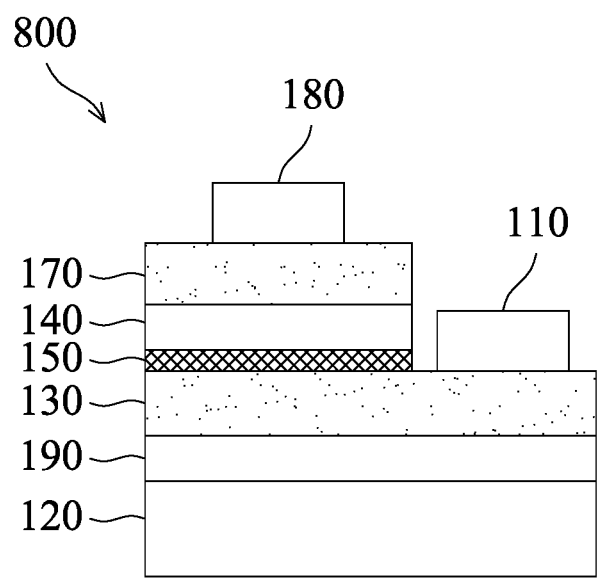
FIG. 7 is a cross-sectional view showing a light-emitting device according to another embodiment of the present disclosure.

FIG. 7 is a cross-sectional view showing a light-emitting device according to another embodiment of the present disclosure. As shown in FIG. 7, the light-emitting device 800 may include a substrate 120, a first semiconductor structure 130, an active structure 140, a first blocking layer 150, a second semiconductor structure 170, a first electrode 110, and a second electrode 180. In the embodiment, the bonding layer 190 may be provided between the first semiconductor structure 130 and the substrate 120. The first electrode 110 and the second electrode 180 may be all on the same side of the substrate 120.

In an embodiment, the bonding layer 190 is used for connecting the first semiconductor structure 130 and the substrate 120. The material of the bonding layer 190 may include conductive oxide, metal, or alloy. The conductive oxide may include indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium zinc oxide (GZO), indium tungsten oxide (IWO), zinc oxide (ZnO), or indium zinc oxide (IZO). The metal may include aluminum (Al), indium (In), chromium (Cr), copper (Cu), tin (Sn), gold (Au), nickel (Ni), titanium (Ti), platinum (Pt), lead (Pb), zinc (Zn), cadmium (Cd), antimony (Sb) or cobalt (Co). The alloy may include at least two elements selected from the above metal elements. In some embodiments, the light-emitting device 800 may further include a second blocking layer (not shown). For the position and material of the second blocking layer, the foregoing embodiments can be referred to, and are not repeatedly described herein.

Based on the above, according to some embodiments, by providing the first blocking layer on the light-emitting device, the dopant in the first semiconductor structure or the second semiconductor structure can be prevented from diffusing outwardly, and the reliability of the light-emitting device can be improved while maintaining brightness performance of the light-emitting device. According to some embodiments, a second blocking layer may be further disposed above or below the first blocking layer, and the second blocking layer may be adjacent to the first blocking layer, thereby diffusion of the dopant may be further restricted, and the lattice difference between the first blocking layer and the other layers may be alleviated to further improve the reliability and yield of the light-emitting device.

The light-emitting device of the present disclosure can be applied to products in the fields of illumination, display, communication, sensing, power supply systems, such as lamps, monitors, mobile phones, tablet computers, vehicle dashboards, televisions, computers, wearable devices (for example, watches, bracelets, or necklaces), traffic signs, or outdoor displays.

It should be realized that each of the embodiments mentioned in the present disclosure is only used for describing the present disclosure, but not for limiting the scope of the present disclosure. Any obvious modification or alteration is not departing from the spirit and scope of the present disclosure. Same or similar components in different embodiments or components having the same numerals in different embodiments may have same physical or chemical characteristics. Furthermore, above-mentioned embodiments can be combined or substituted under proper condition and are not limited to specific embodiments described above. A connection relationship between a specific component and another component specifically described in an embodiment may also be applied in another embodiment and is within the scope as claimed in the present disclosure.

What is claimed is:

1. A light-emitting device, comprising:
a first semiconductor structure having a first conductivity type;
an active structure on the first semiconductor structure and having a first dopant;
a second semiconductor structure on the active structure and having a second conductivity type different from the first conductivity type; and
a first blocking layer between the second semiconductor structure and the active structure, wherein the first blocking layer has the first dopant with a first doping concentration decreasing along a depth direction from the second semiconductor structure to the first semiconductor structure.

2. The light-emitting device of claim 1, wherein the first dopant has a second doping concentration in the active structure, wherein the first doping concentration is higher than the second doping concentration.

3. The light-emitting device of claim 1, wherein the first blocking layer and the active structure include a III-V group semiconductor material including arsenic (As) or phosphorus (P), and the first blocking layer is substantially free of aluminum.

4. The light-emitting device of claim 1, wherein the first blocking layer includes $In_xGa_{(1-x)}P$, wherein $0<x\leq 0.5$.

5. The light-emitting device of claim 1, further comprising a second blocking layer having the first dopant with a third doping concentration between the second semiconductor structure and the first blocking layer, or between the first blocking layer and the active structure; wherein the third doping concentration decreases along the depth direction.

6. The light-emitting device of claim 1, wherein the first blocking layer has tensile strain.

7. The light-emitting device of claim 5, wherein the first blocking layer comprises aluminum with a first aluminum content, and the second blocking layer comprises aluminum with a second aluminum content higher than the first aluminum content.

8. The light-emitting device of claim 5, wherein the first blocking layer has a first thickness, and the second blocking layer has a second thickness larger than the first thickness.

9. The light-emitting device of claim 5, wherein the third doping concentration is lower than the first doping concentration.

10. The light-emitting device of claim 5, wherein the second blocking layer and the active structure are lattice-matched.

11. The light-emitting device of claim 8, wherein a ratio of the second thickness to the first thickness is in the range of 10:1 to 30:1.

12. The light-emitting device of claim 1, wherein the first blocking layer has a band gap, the active structure emits a radiation having an energy during operation and the band gap is greater than or equal to the energy.

13. The light-emitting device of claim 1, wherein the first blocking layer has a third conductivity type the same as the second conductivity type.

14. The light-emitting device of claim 1, wherein the second semiconductor structure includes the first dopant, and has a fourth doping concentration in the second semiconductor structure, and the first doping concentration is higher than the fourth doping concentration.

15. The light-emitting device of claim 1, wherein the first semiconductor structure and the second semiconductor structure are devoid of nitrogen.

16. The light-emitting device of claim 1, further comprising a substrate under the first semiconductor structure and a bonding layer between the substrate and the first semiconductor structure.

17. The light-emitting device of claim 1, wherein the first dopant has a highest doping concentration near an interface between the second semiconductor structure and the first blocking layer.

18. A light-emitting device, comprising:
a first semiconductor structure having a first conductivity type;
an active structure on the first semiconductor structure and having a first dopant; and
a second semiconductor structure on the active structure, having a second conductivity type different from the first conductivity type and having the first dopant;
wherein the first semiconductor structure and the second semiconductor structure respectively include a semiconductor material containing arsenic (As) or phosphorus (P), and the first dopant has a doping concentration less than $10^{17}$ cm$^{-3}$ in the active structure.

19. The light-emitting device of claim 18, wherein the first dopant includes magnesium (Mg), zinc (Zn), silicon (Si), or tellurium (Te).

20. The light-emitting device of claim 18, wherein the first semiconductor structure and the second semiconductor structure are devoid of nitrogen.

* * * * *